(12) United States Patent
Cartier et al.

(10) Patent No.: US 8,242,560 B2
(45) Date of Patent: Aug. 14, 2012

(54) FINFET WITH THIN GATE DIELECTRIC LAYER

(75) Inventors: Eduard A. Cartier, Yorktown Heights, NY (US); Kangguo Cheng, Albany, NY (US); Bruce B. Doris, Yorktown Heights, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 12/688,347

(22) Filed: Jan. 15, 2010

(65) Prior Publication Data

US 2011/0175163 A1     Jul. 21, 2011

(51) Int. Cl.
*H01L 27/12* (2006.01)
*H01L 21/84* (2006.01)

(52) U.S. Cl. ........... 257/347; 257/E29.02; 257/E21.561; 438/151

(58) Field of Classification Search ............... 257/347, 257/E29.02, E21.561; 438/151
See application file for complete search history.

(56) References Cited

U.S. PATENT DOCUMENTS 7,221,032 B2 *  5/2007  Kondo ................. 257/401
2004/0198003 A1 * 10/2004  Yeo et al. ............. 438/284

\* cited by examiner

*Primary Examiner* — Lex Malsawma
(74) *Attorney, Agent, or Firm* — Scully, Scott, Murphy & Presser, P.C.; Louis J. Percello, Esq.

(57) ABSTRACT

A semiconductor device is provided that in one embodiment includes at least one semiconductor fin structure atop a dielectric surface, the semiconductor fin structure including a channel region of a first conductivity type and source and drain regions of a second conductivity type, in which the source and drain regions are present at opposing ends of the semiconductor fin structure. A high-k gate dielectric layer having a thickness ranging from 1.0 nm to 5.0 nm is in direct contact with the channel of the semiconductor fin structure. At least one gate conductor layer is in direct contact with the high-k gate dielectric layer. A method of forming the aforementioned device is also provided.

20 Claims, 6 Drawing Sheets

FINFET WITH THIN GATE DIELECTRIC LAYER

BACKGROUND

The present disclosure relates to micro-electronic devices. More particularly, the present disclosure relates to finFET semiconductor devices.

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. For a given device length, the amount of current drive for a FET is defined by the device width (w). Current drive scales proportionally to device width, with wider devices carrying more current than narrower devices. Different parts of integrated circuits (ICs) require the FETs to drive different amounts of current, i.e., with different device widths, which is particularly easy to accommodate in planar FET devices by merely changing the device gate width (via lithography). With conventional planar FET scaling reaching fundamental limits, the semiconductor industry is looking at more unconventional geometries that will facilitate continued device performance improvements. One such class of devices is a finFET.

SUMMARY OF THE INVENTION

The present disclosure, in some embodiments, provides a method of forming a finFET device having a gate dielectric layer with a thickness of less than 5 nm. In one embodiment, the method of forming a semiconductor device includes providing a semiconductor fin structure atop a dielectric surface, wherein the semiconductor fin structure comprises a channel region of a first conductivity type, a source region of a second conductivity, and a drain region of the second conductivity type. The source region and the drain region are on opposing sides of the channel region. The semiconductor fin structure further includes a dielectric cap on at least the channel region of the semiconductor fin structure. A high-k gate dielectric layer is formed in direct contact with the dielectric cap, and the sidewalls of the channel region of the semiconductor fin structure. The high-k gate dielectric layer is also formed on the horizontal portion of the dielectric surface that is adjacent to the portion of the dielectric surface that is underlying the high-k gate dielectric layer that is in direct contact with the sidewalls of the semiconductor fin structure. The high-k dielectric layer is removed from the horizontal portion of the dielectric surface. The high-k gate dielectric layer is recessed below at least an upper surface of the dielectric cap, wherein a remaining portion of the high-k gate dielectric layer is in direct contact with the sidewalls of the semiconductor fin structure. At least one gate conductor is formed directly on the remaining portion of the high-k gate dielectric layer.

In another aspect, a semiconductor device is provided that includes a finFET body and a gate dielectric layer having a thickness of less than 5.0 nm present thereon. In one embodiment, the semiconductor device includes a semiconductor fin structure atop a dielectric surface, in which the semiconductor fin structure includes a channel region of a first conductivity type, source regions of a second conductivity type, and drain regions of the second conductivity type. The source regions and the drain regions are present at opposing ends of the semiconductor fin structure. A high-k gate dielectric layer having a thickness of less than 5.0 nm is in direct contact with the sidewall of the channel region of the semiconductor fin structure. The high-k gate dielectric layer only contacts the dielectric surface at the portion of the dielectric surface that is underlying the high-k gate dielectric layer that is in direct contact with the sidewall of the semiconductor fin structure. At least one gate conductor is in direct contact with the high-k gate dielectric layer.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

Figure 3A:
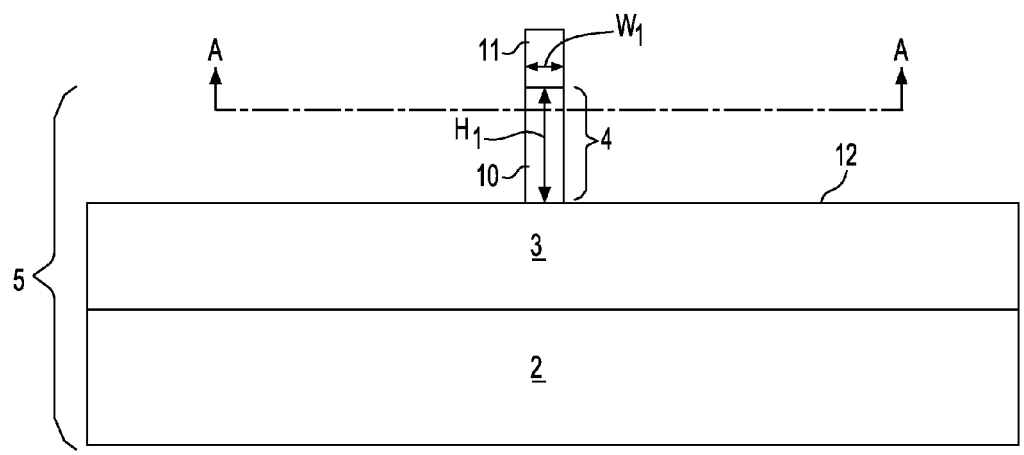

FIG. 3A is a side cross-sectional view depicting forming a semiconductor fin structure from the first semiconductor layer of the SOT substrate, wherein the semiconductor fin structure includes a channel region of a first conductivity type, a source region of a second conductivity, and a drain region of the second conductivity type, and a dielectric cap that is present on an upper surface of the semiconductor fin structure, in accordance with one embodiment of the present method.

Figure 3B:
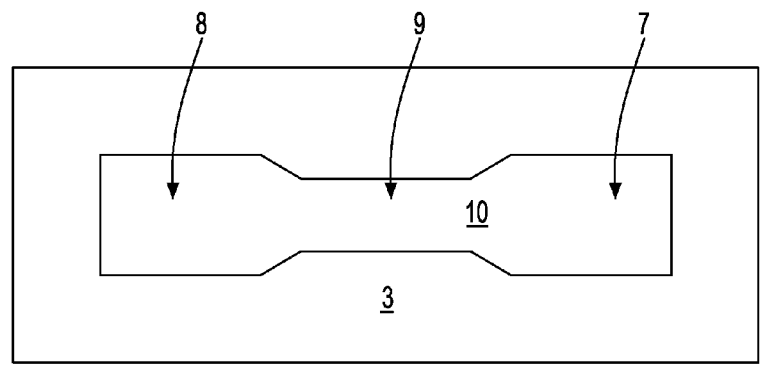

FIG. 3B is a top down cross-sectional view of the structure depicted in FIG. 3A along section line A-A depicting that the source region and the drain region on opposing sides of the channel region.

Figure 4:
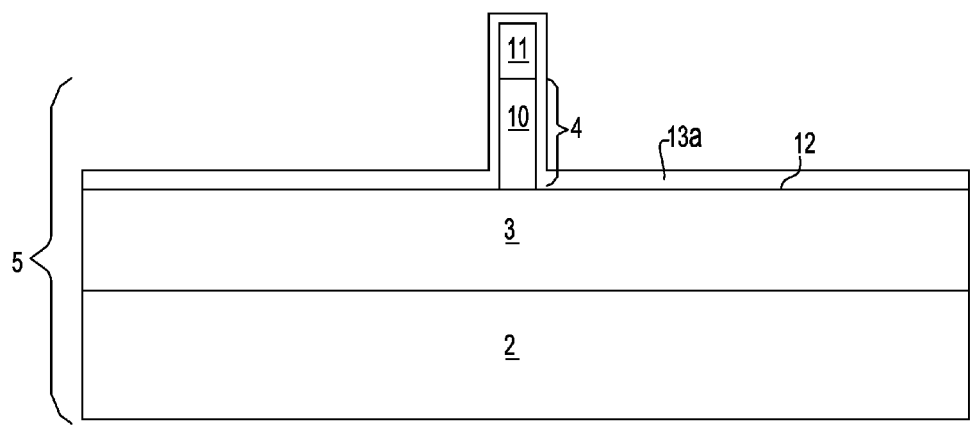

FIG. 4 is a side cross-sectional view depicting forming a high-k gate dielectric layer in direct contact with at least the dielectric cap and the sidewalls of the channel region of the semiconductor fin structure, in accordance with one embodiment of the present method.

Figure 5:
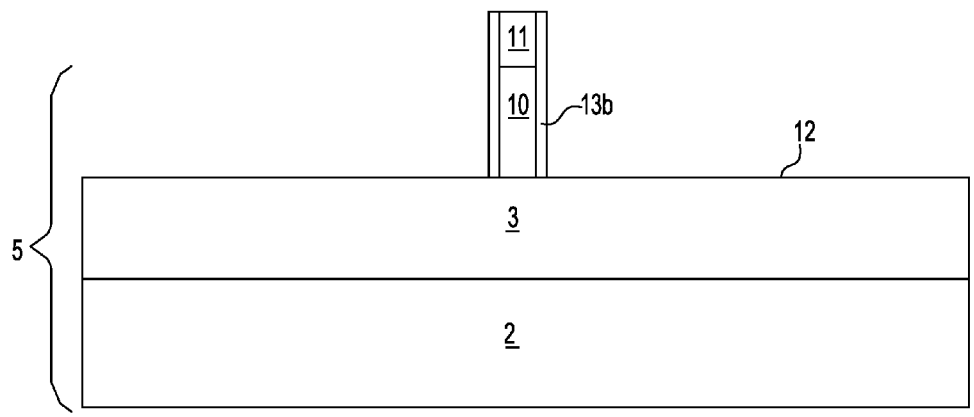

FIG. 5 is a side cross-sectional view depicting removing the horizontal portions of the high-k gate dielectric layer that are present on the upper surface of the dielectric cap and the dielectric surface, in accordance with one embodiment of the present method.

Figure 6:
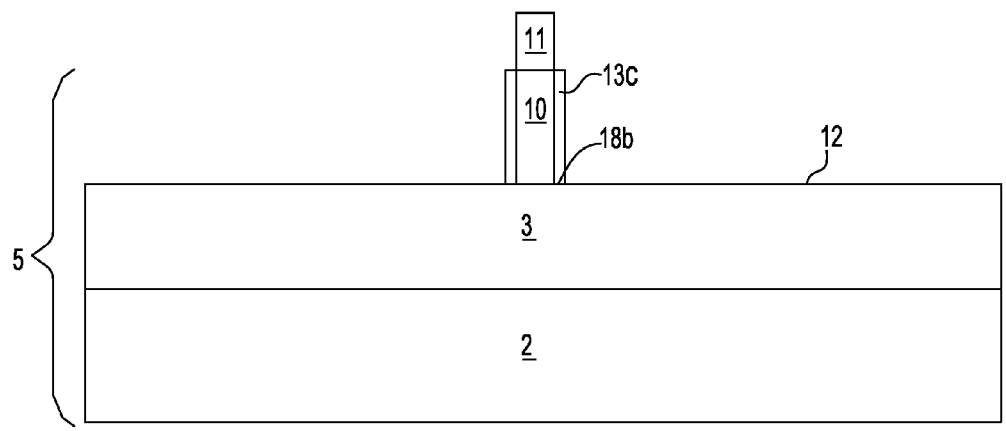

FIG. 6 is a side cross-sectional view depicting recessing the high-k gate dielectric layer below at least an upper surface of the dielectric cap, wherein a remaining portion of the high-k gate dielectric layer is in direct contact with the sidewalls of the semiconductor fin structure, in accordance with one embodiment of the present method.

Figure 7A:
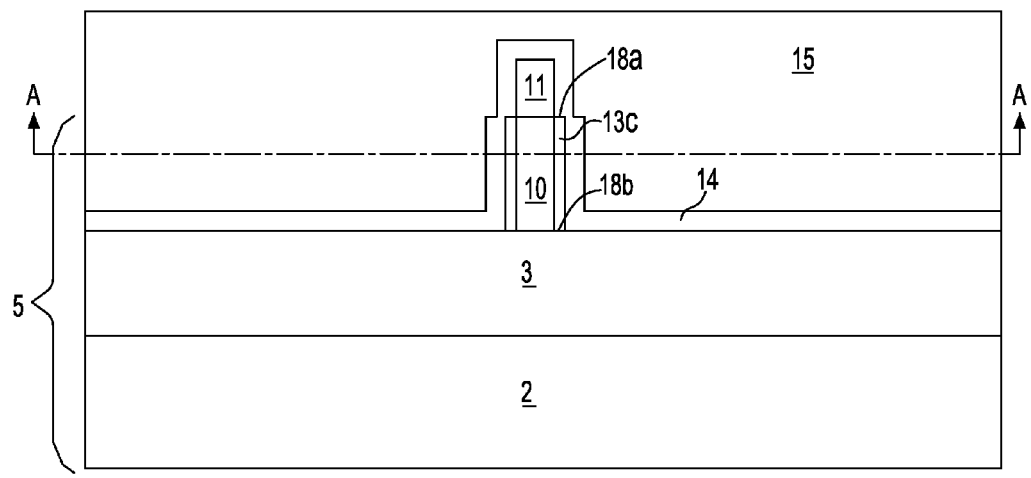

FIG. 7A is a side cross-sectional view depicting a finFET semiconductor device formed from the structure depicted in FIG. 6, in which the gate conductors of the semiconductor device includes a conformal metal layer that is in direct contact with the remaining portion of the high-k gate dielectric layer and extends across an entirety of the dielectric surface, and a conductive semiconductor layer in direct contact with the conformal metal layer, in accordance with one embodiment of the present method.

Figure 7B:
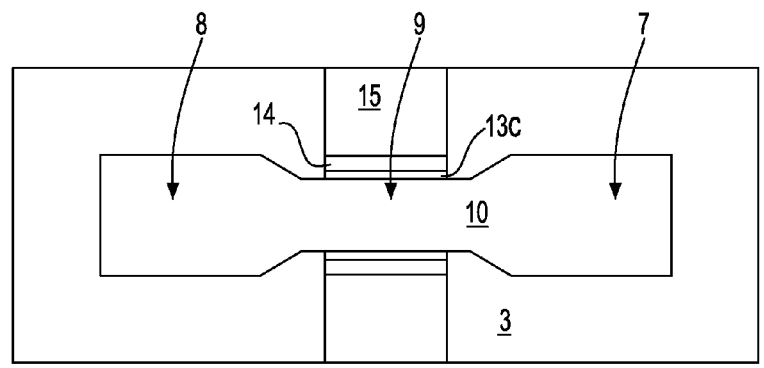

FIG. 7B is a top down cross-sectional view of the structure depicted in FIG. 7A along section line A-A.

Figure 8:
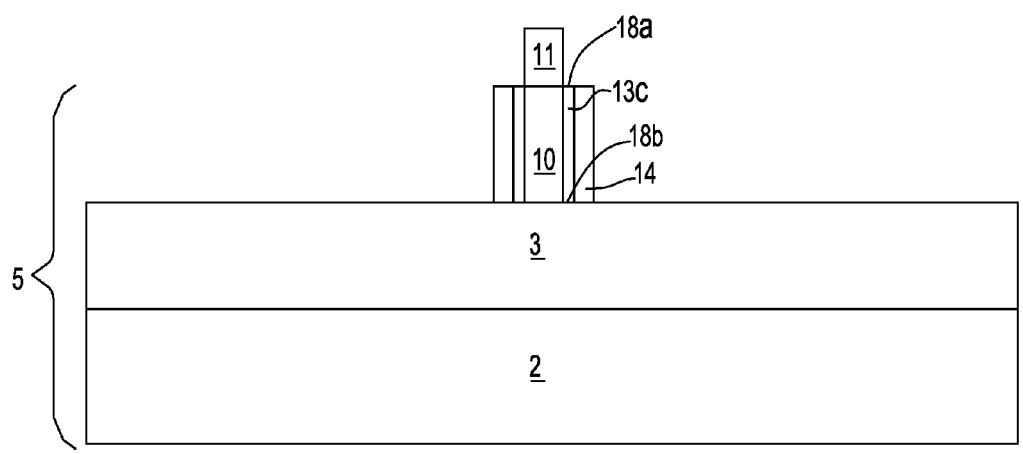

FIG. 8 is a side cross sectional view depicting a finFET semiconductor device formed from the structure depicted in FIG. 6, in which the gate conductors of the semiconductor device include a conformal metal layer that is in direct contact with the remaining portion of the high-k gate dielectric layer, and a conductive semiconductor layer in direct contact with the conformal metal layer, in accordance with a second embodiment of the present method.

Figure 9A:
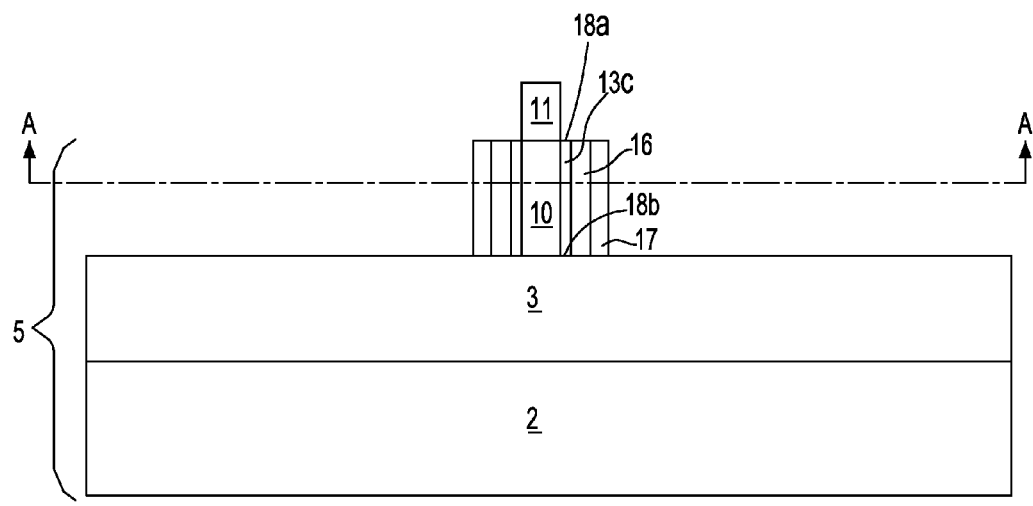

FIG. 9A is a side cross sectional view depicting a finFET semiconductor device formed from the structure depicted in FIG. 6, in which the gate conductors of the semiconductor device includes at least a first metal layer and a second metal layer, in accordance with a second embodiment of the present method.

Figure 9B:
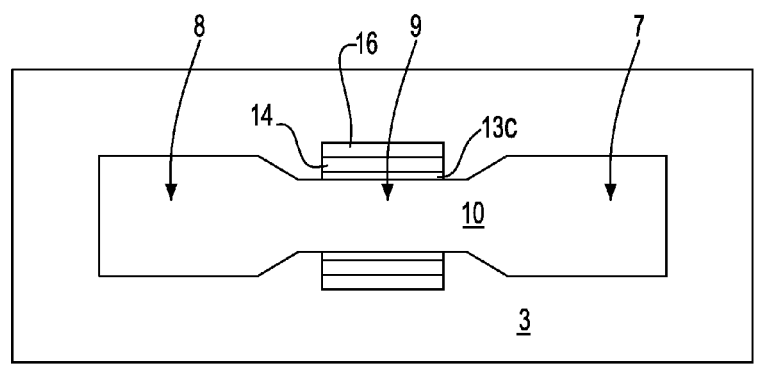

FIG. 9B is a top down cross-sectional view of the structure depicted in FIG. 9A along section line A-A.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present disclosure relates to structures and methods for forming a semiconductor device having a semiconductor fin structure, such as the body of a finFET semiconductor device, that is present on a dielectric surface. Applicants have determined that oxygen atoms that are present in an oxygen-containing buried insulating layer diffuse into high-k gate dielectrics, and decrease the dielectric constant of the high-k gate dielectric. In the present method, a high-k gate dielectric layer is formed on the sidewall of a semiconductor fin structure so that a minimized portion of the high-k gate dielectric layer contacts the dielectric surface 12 of the buried insulating layer 3. Typically, the contact of the high-k gate dielectric layer to the dielectric surface can be minimized to the portion of the dielectric surface that is adjacent to the semiconductor fin structure and is underlying the high-k dielectric layer that is in direct contact with the sidewall of the semiconductor fin structure. In one embodiment, the high-k gate dielectric has a thickness that is less than 5.0 nm, as measured from the sidewall of the semiconductor fin structure. Therefore, the portion of the high-k dielectric layer that is in contact with the dielectric surface may be limited to a 5 nm length of the dielectric surface that is adjacent to the portion of the dielectric surface on which the semiconductor fin structure is present. In some embodiments, by limiting the portion of the high-k gate dielectric layer that is in contact with dielectric materials, such as buried insulating layers and dielectric cap structure, the present method provides a finFET semiconductor device having a more uniform high-k gate dielectric layer. When describing the following structures and methods, the following terms have the following meanings, unless otherwise indicated.

As used herein, "semiconductor device" refers to an intrinsic semiconductor material that has been doped, that is, into which a dopant has been introduced, giving it different electrical properties than the intrinsic semiconductor, in which the switching state from "on" to "off" of the semiconductor device is controlled by a gate structure. Doping involves adding dopant atoms to an intrinsic semiconductor, which changes the electron and hole carrier concentration of the intrinsic semiconductor at thermal equilibrium. Dominant carrier concentrations in an extrinsic semiconductor classify it as either an n-type or p-type semiconductor.

As used herein, a "semiconductor fin structure" refers to a structure composed of a semiconductor material, which is employed as the body of a field effect transistor and includes at least the channel region, the source region and the drain region of the device.

A "finFET" is a semiconductor device in which at the gate dielectric material and gate conductor material are positioned around the semiconductor fin structure such that charge flows down the channel on at least the sidewalls of the semiconductor fin structure.

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element as a layer, region or substrate is referred to as being "on" or "atop" or "over" or "overlying" or "below" or "beneath" or "underlying" another element, it can be directly on the other element or intervening elements may also be present. In contrast, when an element is referred to as being "directly on" or "directly over" or in "direct contact" with another element, there are no intervening elements present.

References in the specification to "one embodiment", "an embodiment", "an example", etc., indicate that the embodiment or example described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments and examples whether or not explicitly described.

Figure 1:
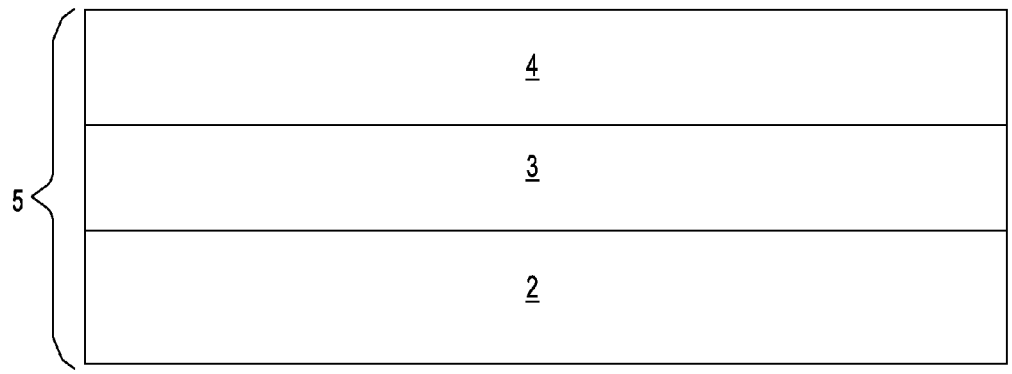
FIG. 1 is a side cross-sectional view depicting a semiconductor on insulator (SOI) substrate including a first semiconductor layer that is present on a buried insulating layer, wherein the buried insulating layer is present on a second semiconductor layer, in accordance with one embodiment of the present method.

FIG. 1 depicts a semiconductor-on-insulator (SOI) substrate 5 that includes a bottom semiconductor layer (second semiconductor layer 2) and a top semiconductor layer (first semiconductor layer 4), in which the top semiconductor layer is interchangeably referred to as an semiconductor-on-insulator (SOI) layer. The first semiconductor layer 4 and the second semiconductor layer 2 are electrically isolated from each other by a buried insulating layer 3. In this example, the SOI substrate 5 may be patterned and etched to provide a semiconductor fin structure 10, in which the first semiconductor layer 4 provides a semiconductor fin structure 10, the buried insulating layer 3 provides an exposed dielectric surface.

The first semiconductor layer 4, i.e., SOI layer, and the second semiconductor layer 2, i.e., bottom semiconductor layer, may comprise at least one of Si, Ge, SiGe, GaAs, InAs, InP, SiCGe, SiC as well as other III/V or II/VI compound semiconductors and alloys thereof. The first semiconductor layer 4 and second semiconductor layer 2 may comprise the same or different materials. In one example, the first semiconductor layer 4 may be amorphous, polycrystalline, or monocrystalline. In one example, the second semiconductor layer 2 may be amorphous, polycrystalline, or monocrystalline. The first semiconductor layer 4 may have a thickness ranging from 1 nm to 100 nm. In another embodiment, the first semiconductor layer 4 may have a thickness ranging from 5 nm to 50 nm. The second semiconductor layer 2 may have a thickness ranging from 5 nm to 1000 nm.

The buried insulating layer 3 separating the first semiconductor layer 4 and the bottom semiconductor layer 2 may be a crystalline or non-crystalline oxide, nitride, oxynitride, or any other suitable insulating material. The buried insulating layer 3 may comprise a single layer of dielectric material or multiple layers of dielectric materials. The buried insulating layer 3 may have a thickness ranging from 1 nm to 100 nm.

Figure 2:
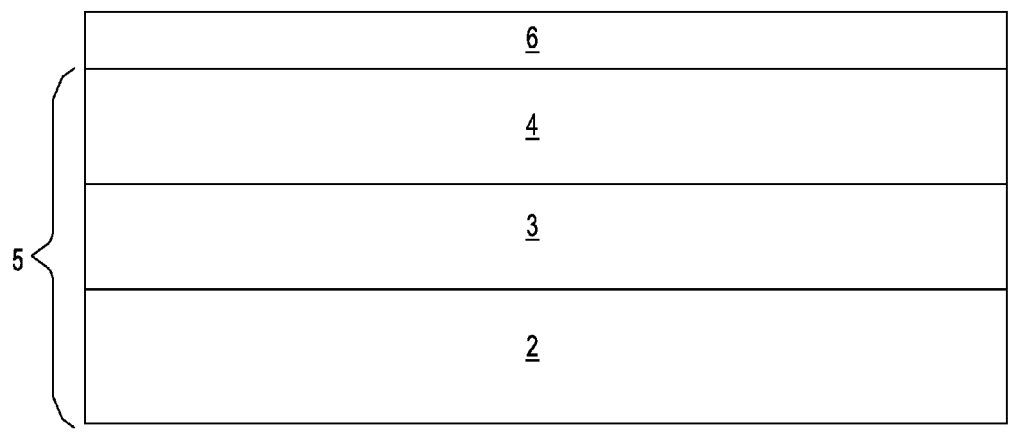
FIG. 2 is a side cross-sectional view depicting forming a dielectric layer on the first semiconductor layer of the SOI substrate, in accordance with one embodiment of the present method.

FIG. 2 depicts forming a dielectric layer 6 on the first semiconductor layer 4 of the SOI substrate 5, in which the dielectric layer 6 is subsequently processed to provide the dielectric cap. The dielectric layer 6 may be composed of any dielectric material that provides for etch selectivity between at least one of the first semiconductor layer 4, and the buried insulating layer 3. In one embodiment, the dielectric layer 6 is comprised of an oxide, nitride or oxynitride material. For example, when the dielectric layer 6 is an oxide, the oxide may be silicon oxide ($SiO_2$). In another example, in which the dielectric layer 6 is a nitride, the nitride may be silicon nitride ($Si_3N_4$). The dielectric layer 6 may be formed by a deposition process, such as chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes include, but are not limited to: Atmospheric Pressure CVD (APCVD), Low Pressure CVD (LPCVD), Plasma Enhanced CVD (EPCVD), Metal-Organic CVD (MOCVD), ultra-high vacuum CVD (UHV-CVD) and combinations thereof. Other examples of processed for depositing a dielectric layer 6 include atomic layer deposition (ALD), evaporation, chemical solution deposition and other like deposition processes. The thickness of the dielectric layer 6 may range from 5 nm to 100 nm. In another embodiment, the thickness of the dielectric layer 6 may range from 10 nm to 50 nm.

FIGS. 3A and 3B depict forming a semiconductor fin structure 10 from the first semiconductor layer 4, i.e., SOI layer, of the SOI substrate 5. A dielectric cap 11 is typically present on an upper surface of the semiconductor fin structure 10. Referring to FIG. 3B, in one embodiment, the semiconductor fin structure 10 includes a channel region 9 of a first conductivity type, a source region 8 of a second conductivity, and a drain region 7 of the second conductivity type. It is noted that FIG. 3B does not depict the dielectric cap 11 so that the channel region 9, source region 8 and drain region 7 may be more clearly illustrated. The channel region 9 is the region underlying the gate structure and between the source region 8 and drain region 7 of a semiconductor device that becomes conductive when the semiconductor device is turned on. The drain region 7 is the doped region in semiconductor device located at the end of the channel region 9, in which carriers are flowing out of the semiconductor device through the drain region 7, and the source region 8 is a doped region in the semiconductor device from which majority carriers are flowing into the channel region 9.

A photolithography and etch process sequence may be utilized to provide the semiconductor fin structure 10 from the SOI substrate 5. Specifically, in one example, a photoresist mask is formed overlying the dielectric layer 6 and the first semiconductor layer 4 of the SOI substrate 5 that are depicted in FIG. 2, in which the portion of the dielectric layer 6 and the first semiconductor layer 4 that is underlying the photoresist mask provides the dielectric cap 11 and the semiconductor fin structure 10 that is depicted in FIG. 3A, and the portion of the dielectric layer 6 and the first semiconductor layer 4 that is not protected by the photoresist mask is removed using a selective etch process to expose the buried insulating layer 3. As used herein, the term "selective" in reference to a material removal process denotes that the rate of material removal for a first material is greater than the rate of removal for at least another material of the structure to which the material removal process is being applied.

To provide the photoresist mask, a photoresist layer is first positioned atop the dielectric layer 6 that is depicted in FIG. 2. The photoresist layer may be provided by a blanket layer of photoresist material that is formed utilizing a deposition process such as, for example, CVD, PECVD, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric layer 6 selective to the first semiconductor layer 4. For example, the transferring of the pattern provided by the photoresist into the dielectric layer 6 may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. The remaining portion of the dielectric layer provides the dielectric cap 11 depicted in FIG. 3A.

In one embodiment, the photoresist is stripped, and the dielectric cap 11 and a second anisotropic etch may be utilized to transfer the pattern from the photoresist mask into the first semiconductor layer 4 to provide the semiconductor fin structure 10. More specifically, during the second anisotropic etch, the portions of the semiconductor layer 4 that are underlying the dielectric cap 11 are protected, while the second anisotropic etch chemistry removes the exposed portions of the first semiconductor layer selective to the dielectric cap 11 and the buried insulating layer 3. The second anisotropic etch may continue until the upper surface of the buried insulating layer 3 that is underlying the unprotected portions of the first semiconductor layer 4 is exposed to provide an exposed dielectric surface 12 of the SOI substrate 5. In another embodiment, the dielectric cap 11 and the semiconductor fin structure 10 are provided by a photoresist mask and a single stage etch process, in which a single etch chemistry etches the dielectric layer 6 and the first semiconductor layer 4. Alternatively, the semiconductor fin structure 10 can be formed by other techniques, such as spacer imaging transfer.

The semiconductor fin structure 10 typically has a greater height $H_1$ than width $W_1$. In one embodiment, the semiconductor fin structure 10 may have a height $H_1$ ranging from 5 nm to 200 nm. In another embodiment, the semiconductor fin structure 10 has a height $H_1$ ranging from 10 nm to 100 nm. In yet another embodiment, the semiconductor fin structure 10 has a height $H_1$ ranging from 20 nm to 50 nm. The semiconductor fin structure 10 may have a width $W_1$ of sub-lithographic dimension. In one embodiment, the semiconductor fin structure 10 has a width $W_1$ ranging from 5 nm to 200 nm. In another embodiment, the semiconductor fin structure 10 has a width $W_1$ ranging from 15 nm to 30 nm.

It is noted that although the semiconductor fin structure 10 is described as being formed from an SOI substrate 5, embodiments of the present invention are contemplated that utilize a bulk semiconductor substrate. In one example, in which a bulk semiconductor substrate is used, the bulk semiconductor substrate comprises at least one of Si, Ge, SiGe, GaAs, InAs, InP, SiCGe, SiC as well as other III/V or II/VI compound semiconductors and alloys thereof. In this example, a dielectric layer is deposited atop the bulk substrate followed by the deposition of a semiconductor-containing layer. Thereafter, the semiconductor fin structure 10 is formed from the deposited semiconductor-containing layer using photolithography and etching.

In one embodiment, a gate structure may be formed contacting channel region 9 of the semiconductor fin structure 10. A gate structure is a structure used to control output current (i.e., flow of carriers in the channel, e.g., turn "on" or "off") of a semiconductor device through electrical or magnetic fields. The gate structure may include at least one gate conductor and at least one gate dielectric, wherein the gate dielectric is positioned between the gate conductor and the semiconductor fin structure 10. In one embodiment, the gate dielectric is positioned on at least the sidewalls of the semiconductor fin structure 10 in direct contact with the channel region of the device.

FIG. 4 depicts forming a high-k gate dielectric layer 13a in direct contact with at least the dielectric cap 11 and the sidewalls of the channel region of semiconductor fin structure 10. In one embodiment, the terms "dielectric and/or insulating" as used to describe the electrical properties of a material means a material having a room temperature conductivity of less than $10^{-10}(\Omega\text{-m})^{-1}$. In some embodiments, the high-k gate dielectric layer 13a is deposited using a conformal deposition method. The term "conformal" denotes a layer having a thickness that does not deviate from greater than or less than 20% of an average value for the thickness of the layer. Specifically, in one embodiment, the high-k gate dielectric layer 13a is formed in direct contact with the dielectric surface 12 of the buried insulating layer 3, the sidewalls of the semiconductor fin structure 10, and the sidewalls and upper surface of the dielectric cap 11.

In one embodiment, the high-k gate dielectric layer 13a may be formed by a thermal growth process such as, for example, oxidation, nitridation or oxynitridation. The high-k gate dielectric layer 13a may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. The high-k gate dielectric layer 13a may also be formed utilizing any combination of the above processes. Any deposition process that is suitable for depositing a high-k dielectric layer having a thickness of less than 5.0 nm is suitable for use with the present method.

The high-k gate dielectric layer 13a may be composed of an oxide, a nitride, an oxynitride or combinations and multilayers thereof. The high-k gate dielectric layer 13a may be a high-k dielectric material having a dielectric constant greater than silicon oxide. In one embodiment, the high-k gate dielectric layer 13a is comprised of a high-k dielectric material having a dielectric constant greater than about 4.0, e.g., 4.1. In another embodiment, the high-k gate dielectric layer 13a is comprised of a high-k dielectric material having a dielectric constant greater than 7.0. In yet another embodiment, the high-k gate dielectric layer 13 is comprised of a high-k dielectric material having a dielectric constant ranging from greater than 4.0 to 30. The dielectric constants mentioned herein are relative to a vacuum.

Some examples of high-k dielectric materials suitable for the high-k gate dielectric layer 13a include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

In one embodiment, the physical thickness of the high-k gate dielectric layer 13a may be as great as 5.0 nm. In another embodiment, the high-k gate dielectric layer 13a has a thickness ranging from 1.0 nm to 5.0 nm. In yet another embodiment, the high-k gate dielectric layer 13a has a thickness ranging from 2.0 nm to 3.0 nm.

In one example, the high-k gate dielectric layer 13a is comprised of a high-k gate dielectric, such as hafnium oxide ($HfO_2$), that is deposited by plasma enhanced chemical vapor deposition (PECVD) or atomic layer deposition (ALD), and has a thickness ranging from 2.0 nm to 3.0 nm.

The high-k gate dielectric layer 13a is etched to remove the horizontal portions of the high-k gate dielectric layer that are present on the upper surface of the dielectric cap 11 and the dielectric surface 12. In one embodiment, the horizontal portions of the high-k gate dielectric layer 13a are removed by an anisotropic etch. The uniform thickness of the high-k gate dielectric layer 13a, and the directional nature of the anisotropic etch, provides that the lesser thickness (as measured from the upper surface of the buried insulating layer 3) of the gate dielectric layer 13a that only contacts horizontal surfaces is removed quicker than the greater thickness (as measured from the upper surface of the buried insulating layer 3) of the gate dielectric layer 13a that contacts the sidewalls of the semiconductor fin structure 10 and the sidewalls of the dielectric cap 11.

Examples of anisotropic etch processes suitable for removing the horizontal portions of the high-k gate dielectric layer 13a include reactive ion etching (RIE), ion beam etching, plasma etching, laser ablation or combinations thereof. In one embodiment, the anisotropic etch process that removes the horizontal portions of the high-k gate dielectric layer 13a includes an etch chemistry that removes the high-k gate dielectric layer 13a selective to the dielectric surface 12 of the buried insulating layer 2 and the dielectric cap 11. Following removal of the horizontal portions of the high-k gate dielectric layer 13a, the remaining portion of the high-k gate dielectric layer 13b is present only on the sidewalls of the dielectric cap 11 and the semiconductor fin structure 10, as depicted in FIG. 5.

In a following process sequence, the upper surface of the remaining portion of the high-k gate dielectric layer 13b is recessed below at least an upper surface of the dielectric cap 11. In one embodiment, the upper surface of the remaining portion of the high-k gate dielectric layer 13b is recessed by an anisotropic etch process. Examples of anisotropic etch processes suitable for recessing the upper surface of the remaining portion of the high-k gate dielectric layer 13a include reactive ion etching (RIE), ion beam etching, plasma etching, laser ablation or combinations thereof. In one embodiment, the anisotropic etch process that recesses the upper surface of the high-k gate dielectric layer 13 includes an etch chemistry that removes the high-k gate dielectric layer 13b selective to the dielectric surface 12 of the buried insulating layer 3 and the dielectric cap 11.

Referring to FIG. 6, in one embodiment, the remaining portion of the high-k gate dielectric 13c is recessed half the height of the dielectric cap 11. In another embodiment, the remaining portion of the high-k gate dielectric layer 13c is recessed three quarters the height of the dielectric cap 11. In yet another embodiment, the remaining portion of the high-k gate dielectric layer 13c is recessed until the upper surface of the high-k gate dielectric layer 13b is coplanar with the lower surface of the dielectric cap 11, which is the interface of the dielectric cap 11 and the upper surface of the semiconductor fin structure 10.

FIGS. 7A-9B depict forming at least one gate conductor in direct contact with the recessed high-k gate dielectric 13c. The at least one gate conductor may comprise any conductive material including but not limited to polysilicon; a conductive elemental metal such as Al, Ti, W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof. FIGS. 7A and 7B depict one embodiment of at least one gate conductor that includes a conformal metal layer 14 in direct contact with the remaining portion of the high-k gate dielectric layer 13c, in which the conformal metal layer 14 extends across an entirety of the dielectric surface 12. In one embodiment, a conductive semiconductor layer 15 is present in direct contact with the conformal metal layer 14.

In one embodiment, the conformal metal layer 14 of gate structure is formed on the high-k gate dielectric layer 13c utilizing a deposition process, such as physical vapor deposition (PVD), CVD or evaporation. Examples of suitable physical vapor deposition (PVD) processes for depositing the conformal metal layer 14 include sputtering, plating and a combination thereof. The conformal metal layer 14 may comprise a metal or a metal-silicon-nitride such as Ta—Si—N. Examples of metals that can be used as the conformal metal layer 14 include, but are not limited to Al, W, Ti, Cu, Pt, Ag, Au, Ru, Ir, Rh, and Re or combinations and alloys thereof. The physical thickness of the conformal metal layer 14 may range from 1 nm to 50 nm. In another embodiment, conformal metal layer 14 has a thickness ranging from 5 nm to 25 nm. In yet another embodiment, the conformal metal layer 14 has a thickness ranging from 10 nm to 20 nm.

In one embodiment, the conductive semiconductor layer 15 is deposited into direct contact with the conformal metal layer 14. As used herein, "conductive" denotes a room temperature conductivity of greater than about $10^{-8}(\Omega\text{-m})^{-1}$. The conductive semiconductor layer 15 is typically composed of a silicon-containing material, such as polysilicon. The conductive semiconductor layer 15 is formed in direct contact with the conformal metal layer 14 utilizing a deposition process, such as chemical vapor deposition (CVD), atomic layer deposition (ALD), evaporation, chemical solution deposition or combinations thereof. Variations of CVD processes suitable for depositing the conductive semiconductor layer 15 include, but are not limited to: Atmospheric Pressure CVD (APCVD), Low Pressure CVD (LPCVD), Plasma Enhanced CVD (EPCVD), Metal-Organic CVD (MOCVD), ultra-high vacuum CVD (UHV-CVD) and combinations thereof. The thickness of conductive semiconductor layer 15 may range from 5 nm to 100 nm. In another embodiment, the thickness of conductive semiconductor layer 15 may range from 10 nm to about 50 nm.

The conductive semiconductor layer 15 may be doped or undoped. In the embodiments in which the conductive semiconductor layer 15 is doped, the conductive semiconductor layer 15 may be polysilicon that is doped using an in-situ doping process conducted during the formation of the polysilicon, or the polysilicon may be doped using ion implantation following deposition of the polysilicon layer. The conductive semiconductor layer 15 is typically doped with a p-type or an n-type dopant.

Still referring to FIGS. 7A and 7B, after deposition of the conductive semiconductor layer 15, gate structures are formed including the conductive semiconductor layer 15 and the conformal metal layer 14. In one embodiment, the gate structures are formed by first providing a patterned mask atop the conductive semiconductor layer 15 by deposition and lithography and then transferring the pattern to the conductive semiconductor layer 15 and the conformal metal layer 14. The etching steps may comprise one or more etching processes including anisotropic etching, such as reactive ion etch (RIE). The region of semiconductor fin structure 10 in which the gate conductors 105 cross over is the channel region.

FIG. 8 depicts one embodiment of the present method, in which following the deposition of the conformal metal layer 14 and prior to depositing the conductive semiconductor layer (not show in FIG. 8), the horizontal portions of the conformal metal layer 14 that is present on the dielectric surface 12 of the buried insulating layer 3 of the SOI substrate and on the upper surface of the dielectric cap are removed by an anisotropic etch process. Examples of anisotropic etch processes suitable for removing the horizontal portions of the conformal metal layer 14 include reactive ion etching (RIE), ion beam etching, plasma etching, laser ablation or combinations thereof. The remaining portion of the conformal metal layer 14 is present in direct contact with the remaining portion of the high-k gate dielectric layer 13c. Although not depicted in FIG. 8, a doped polysilicon layer may be present overlying and in direct contact with the conformal metal layer 14.

FIGS. 9A and 9B depict another embodiment in which the gate structure includes a first metal layer 16 and a second metal layer 17. The first metal layer 16 is in direct contact with the remaining portion of the high-k gate dielectric layer 13c that is in direct contact with the sidewall of the semiconductor fin structure 10. The second metal layer 17 is in direct contact with the first metal layer 16. The first metal layer 16 and the second metal 17 layer may be composed of the same or a different metal composition. Examples of metals that can be used as the first metal layer 16 and the second metal layer 17 include, but are not limited to Al, W, Ti, Cu, Pt, Ag, Au, Ru, Ir, Rh, and Re or combinations and alloys thereof. Although not depicted in FIGS. 9A and 9B, a doped polysilicon layer may be present overlying and in direct contact with the conformal metal layer 14.

Following the formation of the gate structure, the source regions 8 and drain regions 7 may be doped, e.g., ion implanted, on opposing sides of the channel region 9. Typically, the channel region 9 has a first conductivity type and the source and drain regions are doped with dopants of a second conductivity type. The term "conductivity type" denotes a dopant region being p-type or n-type. For example, dopants may be implanted via ion implantation into each end of the semiconductor fin structure 10 to produce n-type conductivity or p-type conductivity dopant regions, i.e., source and drain regions 8, 7. P-type conductivity dopant regions are produced in Si-containing semiconductor fin structures 10 by doping a portion of the fin structure 10 with group III-A elements of the periodic table of elements, such as B. N-type conductivity is produced in Si-containing semiconductor fin structures 10 by doping the fin structure 10 with group V elements, such as P or As.

Referring to FIGS. 7A, 8 and 9A, in one embodiment, by minimizing the contact of the high-k gate dielectric 13c with the dielectric cap 11 and the dielectric surface 12, the present method provides a high-k gate dielectric having a substantially uniform dielectric constant ranging from the upper surface 18a of the high-k gate dielectric 13c to the lower surface 18b of the high-k gate dielectric 13c. By uniform dielectric constant it is meant that the variation of the dielectric constant from the upper surface 18a of the high-k gate dielectric 13c to the lower surface 18b of the high-k gate dielectric 13c is not greater than +/−5% of the average dielectric constant of the high-k gate dielectric layer 13c.

In one example, a high-k gate dielectric 13c composed of hafnium oxide, and having a physical thickness on the order of 3 nm, has an equivalent oxide thickness (EOT) of approximately 6 Å.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
   providing a semiconductor fin structure atop a dielectric surface, wherein the semiconductor fin structure comprises a channel region of a first conductivity type, a source region of a second conductivity, and a drain region of the second conductivity type, the source region and the drain region are located on opposing sides of the channel region, wherein the semiconductor fin structure further comprises a dielectric cap on at least the channel region of the semiconductor fin structure;
   forming a high-k gate dielectric layer in direct contact with the dielectric cap, the sidewalls of the channel region of the semiconductor fin structure and the horizontal portion of the dielectric surface that is adjacent to a portion of the dielectric surface underlying the high-k gate dielectric that is in direct contact with the sidewalls of the channel region of the semiconductor fin structure;
   removing the high-k dielectric layer from the horizontal portion of the dielectric surface;
   recessing the high-k gate dielectric layer below at least an upper surface of the dielectric cap, wherein a remaining portion of the high-k gate dielectric layer is in direct contact with the sidewalls of the semiconductor fin structure; and
   forming at least one gate conductor directly on the remaining portion of the high-k gate dielectric layer.

2. The method of claim 1, wherein the semiconductor fin structure atop the dielectric surface is formed from a semiconductor on insulator substrate comprising a first semiconductor layer that is present on a buried insulating layer.

3. The method of claim 2, wherein the dielectric cap that is present on the semiconductor fin structure is formed by depositing a dielectric layer atop the first semiconductor layer; patterning the dielectric layer to provide the dielectric cap; and
   etching the first semiconductor layer using the dielectric cap as an etch mask and stopping on the buried insulating layer.

4. The method of claim 1, wherein the high-k gate dielectric layer is also formed in direct contact with the dielectric surface that is adjacent to the semiconductor fin structure.

5. The method of claim 4, wherein the recessing of the high-k gate dielectric layer below the upper surface of the dielectric cap further comprises removing a portion of the high-k gate dielectric layer that is present on an upper surface and sidewalls of the dielectric cap.

6. The method of claim 5, wherein the high-k gate dielectric layer is recessed so that an upper surface of the remaining portion of the high-k gate dielectric layer is present between the upper surface of the dielectric cap and a lower surface of the dielectric cap.

7. The method of claim 1, wherein the recessing of the high-k gate dielectric layer comprises an anisotropic etch.

8. The method of claim 1, wherein the forming at least one gate conductor directly on the high-k gate dielectric layer comprises depositing a conformal metal layer in direct contact with at least the remaining portion of the high-k gate dielectric layer and depositing a conductive semiconductor layer in direct contact with the conformal metal layer.

9. The method of claim 8, wherein the conformal metal layer is deposited in direct contact with the dielectric surface of the substrate, the remaining portion of the high-k gate dielectric layer, and the dielectric cap.

10. The method of claim 9, wherein prior to depositing the conductive semiconductor layer the conformal metal layer is removed from the dielectric surface of the substrate and the dielectric cap, wherein a remaining portion of the conformal metal layer is present in direct contact with the remaining portion of the high-k gate dielectric layer.

11. The method of claim 10, wherein the conductive semiconductor layer comprises doped polysilicon.

12. The method of claim 1, wherein the forming of the at least one gate conductor comprises depositing a first metal layer directly on the high-k gate dielectric layer and a second metal layer directly on the first metal layer, in which the first metal layer has a different composition than the second metal layer.

13. The method of claim 12, further comprising a conductive semiconductor layer directly contacting the second metal layer.

14. A semiconductor device comprising:
   a semiconductor fin structure atop a dielectric surface, the semiconductor fin structure including a channel region of a first conductivity type, source regions of a second conductivity type, and drain regions of the second conductivity type, wherein the source regions and the drain regions are present at opposing ends of the semiconductor fin structure;
   a dielectric fin cap present on an upper surface of the semiconductor fin structure;
   a high-k gate dielectric layer having a thickness no greater than 5.0 nm in direct contact with the channel region of the semiconductor fin structure, wherein the high-k gate dielectric layer only contacts the dielectric surface at a portion of the dielectric surface that is underlying the high-k gate dielectric layer that is in direct contact with a sidewall of the semiconductor fin structure, wherein an upper surface of the high-k gate dielectric layer is present between an upper surface of the semiconductor fin structure and an upper surface of the dielectric fin cap; and
   at least one gate conductor in direct contact with the high-k gate dielectric layer.

15. The semiconductor device of claim 14, wherein the high-k gate dielectric layer is comprised of a high-k dielectric material selected from the group consisting of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

16. The semiconductor device of claim 14, further comprising a dielectric cap present on an upper surface of the semiconductor fin structure, wherein an upper surface of the high-k gate dielectric layer is present on a sidewall of the dielectric cap between the upper surface of the dielectric cap and a lower surface of the dielectric cap, and a lower surface of the high-k gate dielectric layer is present on the dielectric surface.

17. The semiconductor device of claim 16, wherein the lower surface of the high-k gate dielectric layer that is present on the dielectric surface has a thickness ranging of less than 5 nm as measured from a sidewall of the semiconductor fin structure.

18. The semiconductor device of claim 14, wherein the at least one gate conductor layer comprises a metal layer, a conductive semiconductor layer, or a combination thereof.

19. The method of claim 14, wherein the semiconductor fin structure is configured to provide a finFET.

20. A semiconductor device comprising:
a semiconductor fin structure atop a dielectric surface, the semiconductor fin structure including a channel region of a first conductivity type, source regions of a second conductivity type, and drain regions of the second conductivity type, wherein the source regions and the drain regions are present at opposing ends of the semiconductor fin structure;
a dielectric fin cap present on an upper surface of the semiconductor fin structure;
a high-k gate dielectric layer having a thickness no greater than 5.0 nm is in direct contact with the channel region of the semiconductor fin structure, wherein the high-k gate dielectric layer only contacts the dielectric surface at a portion of the dielectric surface that is underlying the high-k gate dielectric layer that is in direct contact with a sidewall of the semiconductor fin structure, wherein an upper surface of the high-k gate dielectric layer is coplanar with an upper surface of the semiconductor fin structure; and
at least one gate conductor in direct contact with the high-k gate dielectric layer.

* * * * *